(12) United States Patent
Huang et al.

(10) Patent No.: US 11,984,379 B2
(45) Date of Patent: May 14, 2024

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Yu-Lung Huang, Taichung (TW); Chih-Ming Huang, Taichung (TW); Kuo-Hua Yu, Taichung (TW); Chang-Fu Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 389 days.

(21) Appl. No.: 17/370,207

(22) Filed: Jul. 8, 2021

(65) Prior Publication Data
US 2022/0399245 A1   Dec. 15, 2022

(30) Foreign Application Priority Data

Jun. 9, 2021  (TW) .................................. 110120987

(51) Int. Cl.
*H01L 23/367* (2006.01)
*H01L 21/48* (2006.01)
*H01L 23/373* (2006.01)
*H01L 23/42* (2006.01)
*H01L 23/00* (2006.01)

(52) U.S. Cl.
CPC ...... *H01L 23/3675* (2013.01); *H01L 21/4871* (2013.01); *H01L 23/3736* (2013.01); *H01L 23/42* (2013.01); *H01L 24/73* (2013.01); *H01L 2224/73204* (2013.01)

(58) Field of Classification Search
None
See application file for complete search history.

(56) References Cited

U.S. PATENT DOCUMENTS

| | | | | |
|---|---|---|---|---|
| 6,281,573 | B1 * | 8/2001 | Atwood | H01L 23/3675 257/710 |
| 2004/0262766 | A1 * | 12/2004 | Houle | H01L 23/04 257/E23.087 |
| 2006/0113105 | A1 * | 6/2006 | Kubo | H01L 23/3675 257/E23.09 |
| 2006/0118925 | A1 * | 6/2006 | Macris | H01L 23/26 257/667 |
| 2014/0061893 | A1 * | 3/2014 | Saeidi | H01L 23/562 438/122 |
| 2019/0393118 | A1 * | 12/2019 | Rawlings | H01L 24/29 |
| 2020/0168523 | A1 * | 5/2020 | Huang | F28F 13/18 |
| 2021/0327782 | A1 * | 10/2021 | Han | H01L 23/3675 |

* cited by examiner

*Primary Examiner* — Benjamin P Sandvik
(74) *Attorney, Agent, or Firm* — Kelly & Kelley, LLP (57) ABSTRACT

Provided is an electronic package, in which a heat dissipating body is formed on an electronic device and is combined with a heat sink so that the electronic device, the heat dissipating body and the heat sink form a receiving space, and a heat dissipating material is formed in the receiving space and in contact with the heat sink and the electronic device, where a fluid regulating space is formed between the heat dissipating material and the heat dissipating body and is used as a volume regulating space for the heat dissipating material during thermal expansion and contraction.

26 Claims, 12 Drawing Sheets

ELECTRONIC PACKAGE AND MANUFACTURING METHOD THEREOF

BACKGROUND

1. Technical Field

The present disclosure relates to a package structure, and more particularly, to an electronic package with a heat sink and a manufacturing method thereof.

2. Description of Related Art

With the increasing demands in electronic products in terms of functionalities and processing speeds, semiconductor chips, which serve as one of the core components in electronic products, require electronic components and electronic circuits of higher densities. As a result, during operations of the semiconductor chips, larger amount of heat energy will be generated. Moreover, an encapsulant encapsulating a semiconductor chip is typically a material of low heat transfer capability with a thermal conductivity of only 0.8 $W \cdot m^{-1} \cdot k^{-1}$, in other words, efficiency of heat dissipation is poor. If heat generated by the semiconductor chip cannot be dissipated efficiently, damage to the semiconductor chip or reliability issues may occur.

Therefore, in order to dissipate heat quickly to the outside, a heat sink or heat spreader is usually disposed in a semiconductor package. The heat sink or heat spreader is typically bonded to the back of a semiconductor chip via a thermal paste (e.g., a thermal interface material or TIM), such that heat generated by the semiconductor chip can be dissipated by the thermal paste and the heat sink. Furthermore, the top of the heat sink is typically exposed from an encapsulant or directly exposed to the atmosphere to achieve even better heat dissipation.

Figure 1:
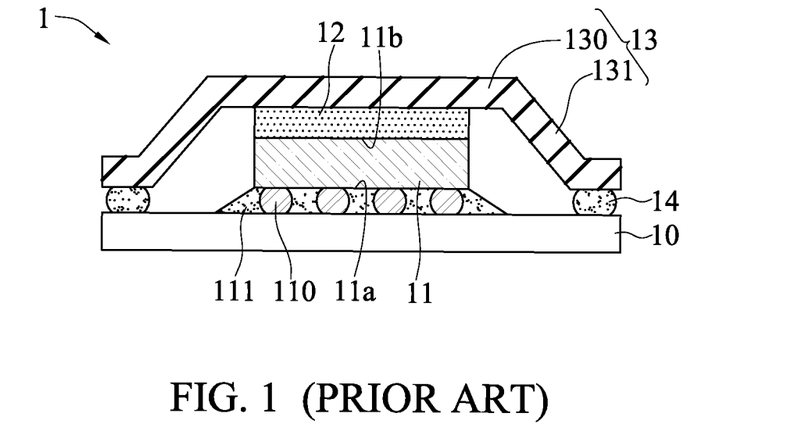
FIG. 1 is a schematic cross-sectional view of a conventional semiconductor package.

As shown in FIG. 1, a conventional semiconductor package 1 includes a semiconductor chip 11 with an active face 11a of the semiconductor chip 11 disposed on a package substrate 10 through flip-chip bonding (i.e., via conductive bumps 110 and an underfill 111). A top plate 130 of a heat sink 13 is bonded onto a non-active face 11b of the semiconductor chip 11 via a TIM layer 12, and support legs 131 of the heat sink 13 are placed on the package substrate 10 through an adhesive layer 14.

During operation, heat generated by the semiconductor chip 11 is conducted to the top plate 130 of the heat sink 13 through the non-active face 11b and the TIM layer 12 in order to be dissipated to the outside of the semiconductor package 1.

Furthermore, in order to accommodate the trends of more contacts (I/Os), large package scales and areas, high heat dissipation, etc. for electronic products, liquid metals instead of the conventional solid materials have been adopted as the TIM layer 12.

However, in the conventional semiconductor package 1, since the TIM layer 12 is a liquid metal that will expand in high temperature, the TIM layer 12 cannot be securely disposed onto the non-active face 11b of the semiconductor chip 11, and may even flow out of the semiconductor package 1, thereby causing contamination to other components outside of the semiconductor package 1.

Therefore, there is a need for a solution that addresses the aforementioned issues of the prior art.

SUMMARY

In view of the aforementioned shortcomings of the prior art, the present disclosure provides an electronic package, which includes: a carrier structure; an electronic component disposed on the carrier structure; a heat dissipating body disposed on the electronic component in a loop; a heat sink disposed on the heat dissipating body, wherein the electronic component, the heat dissipating body and the heat sink form a receiving space; and a heat dissipating material formed in the receiving space and in contact with the heat sink and the electronic component, wherein a fluid regulating space is formed between the heat dissipating material and the heat dissipating body.

The present disclosure further provides a method of manufacturing an electronic package, the method including: providing a heat generating object and a heat sink, wherein the heat generating object includes a carrier structure and an electronic component disposed on the carrier structure; disposing a heat dissipating body on the electronic component in a loop; forming a heat dissipating material on the electronic component; and disposing the heat sink on the heat dissipating body, wherein the electronic component, the heat dissipating body and the heat sink form a receiving space, wherein the heat dissipating material is inside the receiving space and in contact with the heat sink and the electronic component, and wherein a fluid regulating space is formed between the heat dissipating material and the heat dissipating body.

In the aforementioned electronic package and manufacturing method thereof, the fluid regulating space contains air or the heat dissipating material.

In the aforementioned electronic package and manufacturing method thereof, the heat dissipating body surrounds the heat dissipating material in a loop, such that an outer periphery of the heat dissipating material and an inner periphery of the heat dissipating body define the fluid regulating space.

In the aforementioned electronic package and manufacturing method thereof, the heat dissipating body is provided along an upper surface edge of the electronic component.

In the aforementioned electronic package and manufacturing method thereof, the heat dissipating body is formed with at least one regulating channel, wherein the regulating channel includes a gas segment interconnected the fluid regulating space with an outside of the heat dissipating body. For example, the regulating channel further includes a fluid segment formed on an inner loop surface, and wherein the fluid segment is in communication with the gas segment in a tapered fashion that narrows towards the gas segment, such that the fluid segment defines the fluid regulating space. Alternatively, a minimum width of the regulating channel is in a range of 10 to 1200 μm. Furthermore, a minimum width of the regulating channel is in a range of 10 to 800 μm.

In the aforementioned electronic package and manufacturing method thereof, a volume of the fluid regulating space is greater than or equal to a difference between a volume expansion of the heat dissipating material when heated and a change in volume of the receiving space when heated.

In the aforementioned electronic package and manufacturing method thereof, a ratio of a volume of the fluid regulating space and a volume of the heat dissipating material is in a range of 27.72 to 146.16 $\mu m^3/mm^3$.

In the aforementioned electronic package and manufacturing method thereof, the heat sink includes a recess corresponding to the receiving space, wherein the recess is filled with the heat dissipating material. For example, the recess is an indentation located on the heat sink corresponding to a center of the receiving space. Alternatively, the recess is a groove disposed on the heat sink corresponding to an edge of the receiving space. Alternatively, the heat sink further includes an auxiliary channel interconnected with the recess. Furthermore, the heat dissipating body is formed with at least one regulating channel, wherein the regulating channel includes a gas segment interconnected the fluid regulating space with an outside of the heat dissipating body, such that the auxiliary channel is in communication or not in communication with the gas segment.

As can be understood from the above, the electronic package of the present disclosure and the manufacturing method thereof can effectively prevent the heat dissipating material from flowing out of the electronic package by the heat dissipating body, thereby preventing contamination of other components external to the electronic package. Also, the fluid regulating space formed between the heat dissipating body and the heat dissipating material can be used as a volume regulating space for the heat dissipating material during thermal expansion and contraction, thereby avoiding a "popcorn" effect caused by the incompressible nature of the fluid.

BRIEF DESCRIPTION OF THE DRAWINGS

FIGS. 2A-1, 2B and 2C-1 are schematic cross-sectional views illustrating a method of manufacturing an electronic package in accordance with a first embodiment of the present disclosure.

FIG. 2A-2 is a schematic top view of FIG. 2A-1.

FIG. 2C-2 is a schematic enlarged partial cross-sectional view of FIG. 2C-1 without a heat dissipating material.

FIG. 2C-3 is a schematic cross-sectional view of FIG. 2C-1 in another aspect.

FIG. 2D-1 is a schematic top view of FIG. 2C-1 without the heat sink.

FIG. 2D-2 is a schematic enlarged partial top view of FIG. 2D-1.

FIG. 2D-3 is a schematic top view of FIG. 2D-2 in another aspect.

FIGS. 3A-1, 3B and 3C are schematic cross-sectional views illustrating a method of manufacturing an electronic package in accordance with a second embodiment of the present disclosure.

FIG. 3A-2 is a schematic bottom planar view of a heat sink of FIG. 3A-1, wherein FIG. 3A-1 is a cross-sectional view along an A-A line in FIG. 3A-2.

FIG. 3D-1 is a schematic cross-sectional view of the manufacturing process shown in FIG. 3C after compression.

FIG. 3D-2 is a schematic top view of FIG. 3C without the heat sink.

FIGS. 4A-1, 4B and 4C-1 are schematic cross-sectional views illustrating a method of manufacturing an electronic package in accordance with a third embodiment of the present disclosure.

FIG. 4A-2 is a schematic bottom planar view of a heat sink of FIG. 4A-1, wherein FIG. 4A-1 is a cross-sectional view along a B-B line in FIG. 4A-2.

FIG. 4C-2 is a schematic top view along C1-C1 cross section in FIG. 4C-1.

FIG. 4D-1 is a schematic enlarged partial cross-sectional view of the manufacturing process shown in FIG. 4C-1 before compression.

FIG. 4D-2 is a schematic enlarged partial cross-sectional view of FIG. 4C-1.

DETAILED DESCRIPTION OF THE EMBODIMENTS

Implementations of the present disclosure are illustrated using the following embodiments. One of ordinary skill in the art can readily appreciate other advantages and technical effects of the present disclosure upon reading the content of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Any modifications, changes or adjustments to the structures, ratio relationships or sizes, are to be construed as falling within the range covered by the technical content disclosed herein to the extent of not causing changes in the technical effects created and the objectives achieved by the present disclosure, Meanwhile, terms such as "above," "first," "second," "a," "an," and the like recited here are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

FIGS. 2A-1, 2B and 2C-1 are schematic cross-sectional views illustrating a method of manufacturing an electronic package 2 in accordance with a first embodiment of the present disclosure.

Figure 2A:
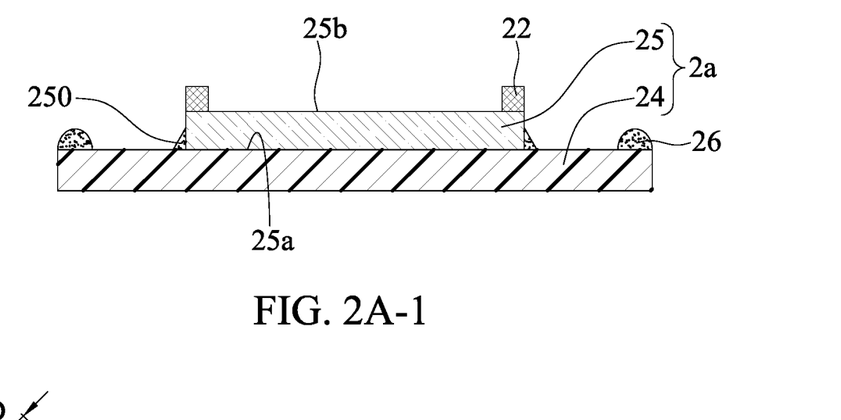

As shown in FIG. 2A-1, a heat generating object 2a is provided, and a heat dissipating body 22 is arranged on the heat generating object 2a.

In an embodiment, the heat generating object 2a is, for example, a package module, which includes a carrier structure 24 and an electronic component 25 disposed on the carrier structure 24. The heat dissipating body 22 is bonded onto the electronic component 25. A bonding material 26 (e.g., an adhesive) is formed on the carrier structure 24.

The carrier structure 24 is, for example, a package substrate with a core layer and circuit structures, a coreless package substrate with circuit structures, a through silicon interposer (TSI) with through silicon vias (TSVs) or another type of board that includes at least one insulating layer and at least one circuit layer bonded to the insulating layer, such as at least one fan-out redistribution layer (RDL). It can be understood that the carrier structure 24 can also be other types of boards that carry chips, such as a lead frame, a wafer, a board with metal routing, and the present disclosure is not limited as such.

The electronic component 25 is an active component, a passive component, a chip module or a combination of the above, wherein the active component is, for example, a semiconductor chip, and the passive component is, for example, a resistor, a capacitor, or an inductor. In an embodiment, the electronic component 25 is a semiconductor chip, which includes an active face 25a (or a lower surface) and a non-active face 25b (or an upper surface) opposite to each other. The active face 25a is disposed on and electrically connected to a circuit layer of the carrier structure 24 via a plurality of conductive bumps (e.g., solder materials, metal pillars, etc.) by flip-chip bonding, and the electronic component 25 is encapsulated by an underfill 250, and the heat dissipating body 22 is bonded onto the non-active face 25b. Alternatively, the electronic component 25 can be electrically connected to the circuit layer of the carrier structure 24 by wire bonding via a plurality of bonding wires (not shown). As yet another alternative, the electronic component 25 can be in direct contact with the circuit layer of the carrier structure 24. It can be understood that there are numerous ways in which the electronic component 25 can be electrically connected to the carrier structure 24, and the types and amount of electronic components disposed on the carrier structure 24 are not limited to those illustrated above.

Figure 2A:
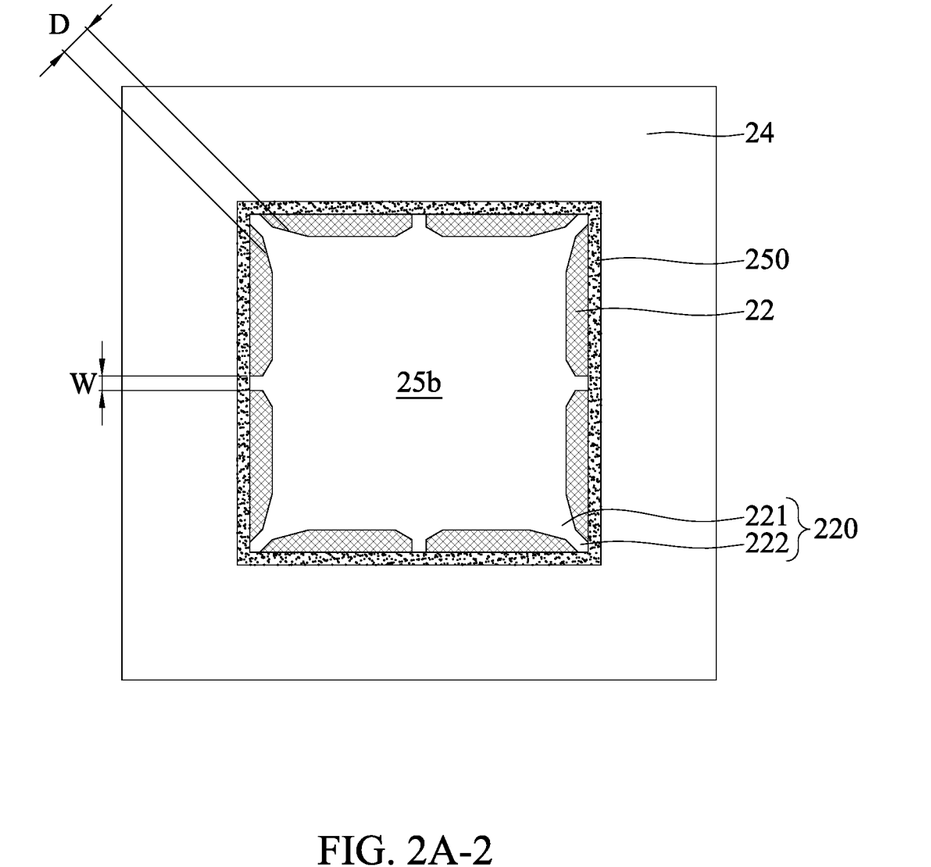

Furthermore, the heat dissipating body 22 is arranged around the edge of the non-active face 25b in a loop. The heat dissipating body 22 is formed with regulating channels 220 (as shown in FIG. 2A-2) for regulating the volume of a heat dissipating material 23 used in the subsequent manufacturing process.

Each of the regulating channels 220 defines a fluid segment 221 interconnected with the non-active face 25b inside the loop of the heat dissipating body 22 and at least one gas segment 222 interconnecting the fluid segment 221 and the outside of the non-active face 25b. For example, one of the opening ends of the gas segment 222 is interconnected with the fluid segment 221, while the other one of the opening ends of the gas segment 222 is away from the fluid segment 221, for example, interconnected with the carrier structure 24 as shown in FIG. 2A-2 or the external environment. Preferably, the cross-sectional area D of the fluid segment 221 becomes narrower towards the gas segment 222 as shown in FIG. 2A-2, and the gas segment 222 is a channel in which the interval between the two opposite sides (i.e., the width W of the gas segment 222) can be tapered (not shown) as needed or uniform (as shown by straight lines in FIG. 2A-2). It can be understood that the path and shape of the channel of the gas segment 222 can be adjusted according to the needs, and the present disclosure is not limited to those described above.

In addition, the heat dissipating body 22 has a low thermal conductivity of about 2 to 20 $W \cdot m^{-1} \cdot k^{-1}$. The heat dissipating body 22 can be a bonding film include a silicone material or an UV glue containing an acrylic material, and can further include fillers such as metal particles, graphite materials or other suitable fillers. For example, the silicone material not only has high malleability, but its thermal conductivity is higher than that of the UV glue. Thus, compared to the UV glue, the silicone material is preferably selected as the heat dissipating body 22.

Figure 2B:
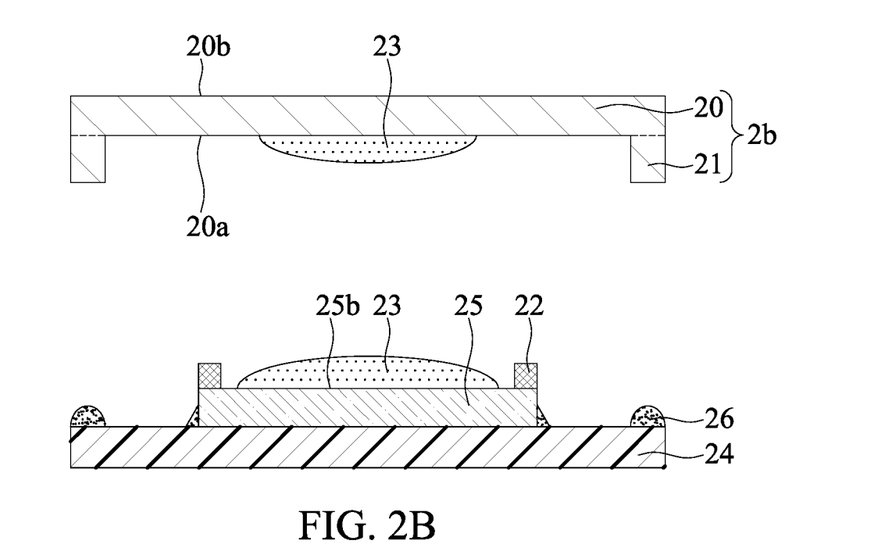
Figure 2C:
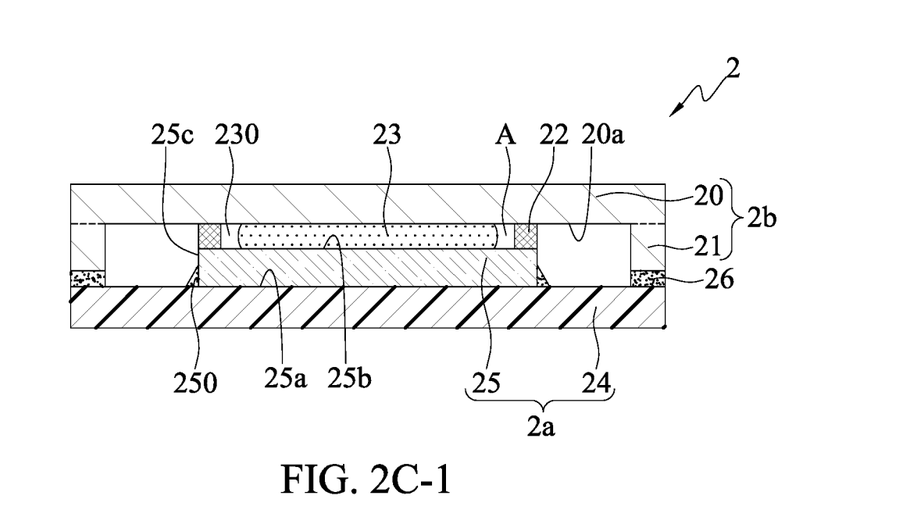

As shown in FIG. 2B, a heat sink 2b is provided, and a heat dissipating material 23 is formed on the non-active face 25b of the electronic component 25, such that the heat dissipating material 23 and the non-active face 25b of the electronic component 25 are tightly joined without other media (e.g., air or other gases). In another embodiment, the heat dissipating material 23 can first be formed, and the bonding material 26 can then be formed on the carrier structure 24.

In an embodiment, the heat dissipating material 23 has high thermal conductivity of about 25 to 80 $W \cdot m^{-1} \cdot k^{-1}$. For example, the heat dissipating material 23 is solid indium (In) or a liquid metal.

Furthermore, the heat sink 2b includes a heat dissipating plate 20 and at least one support leg 21 provided vertically on the heat dissipating plate 20, wherein the heat dissipating plate 20 includes a first side 20a and a second side 20b opposite to each other.

Moreover, the heat dissipating material 23 is positioned inside the loop of the heat dissipating body 22. The heat dissipating material 23 can be correspondingly provided on the surface of the first side 20a of the heat dissipating plate 20 as needed.

In addition, the support leg 21 is provided on an edge of the first side 20a of the heat dissipating plate 20 and extends towards the carrier structure 24.

Figure 2C:
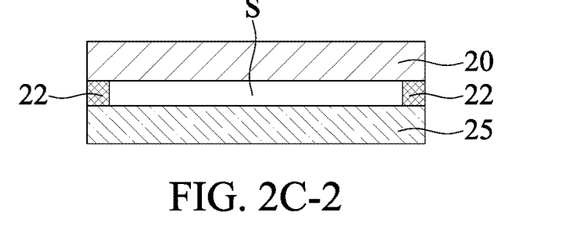

As shown in FIG. 2C-1, the heat sink 2b is bonded onto the heat generating object 2a. For instance, the heat dissipating plate 20 is bonded onto the electronic component 25 of the heat generating object 2a via the heat dissipating material 23, and the support legs 21 of the heat sink 2b are bonded onto the bonding material 26 on the carrier structure 24 of the heat generating object 2a, such that a receiving space S (as shown in FIG. 2C-2) is formed by the non-active face 25b of the electronic component 25, the first side 20a of the heat dissipating plate 20 and the heat dissipating body 22 for receiving the heat dissipating material 23. Then, curing is performed to obtain the desired electronic package 2.

Figure 2C:
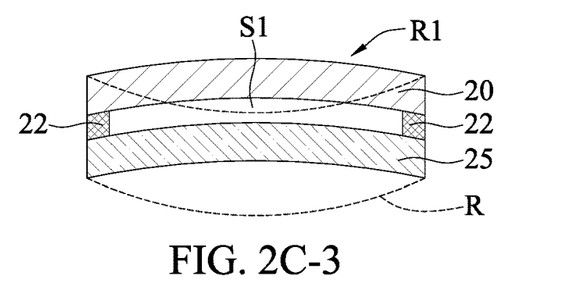
Figure 2D:
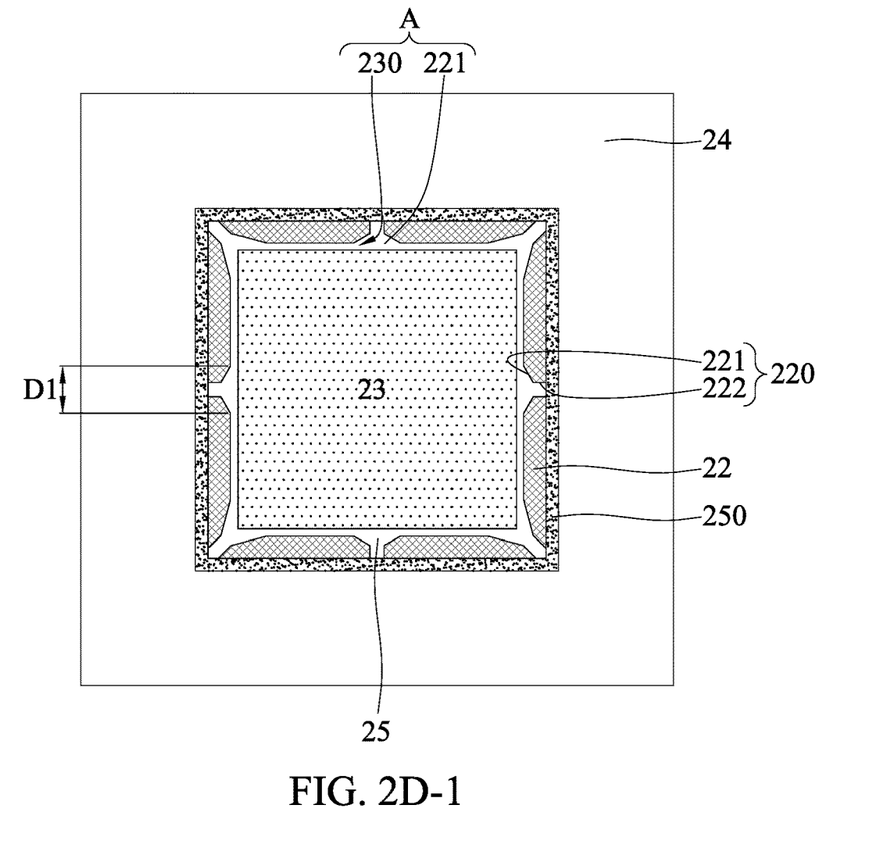
Figure 2D:
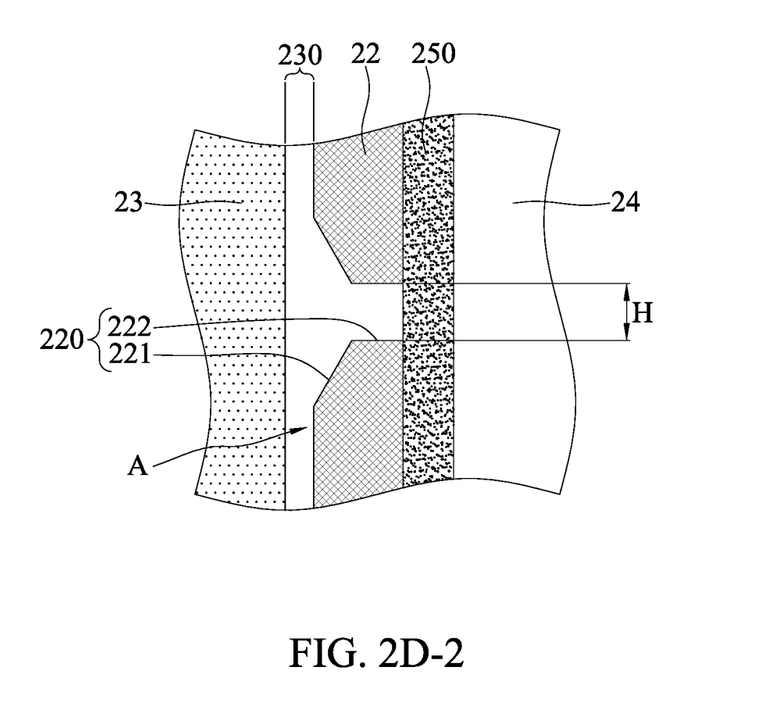
Figure 2D:
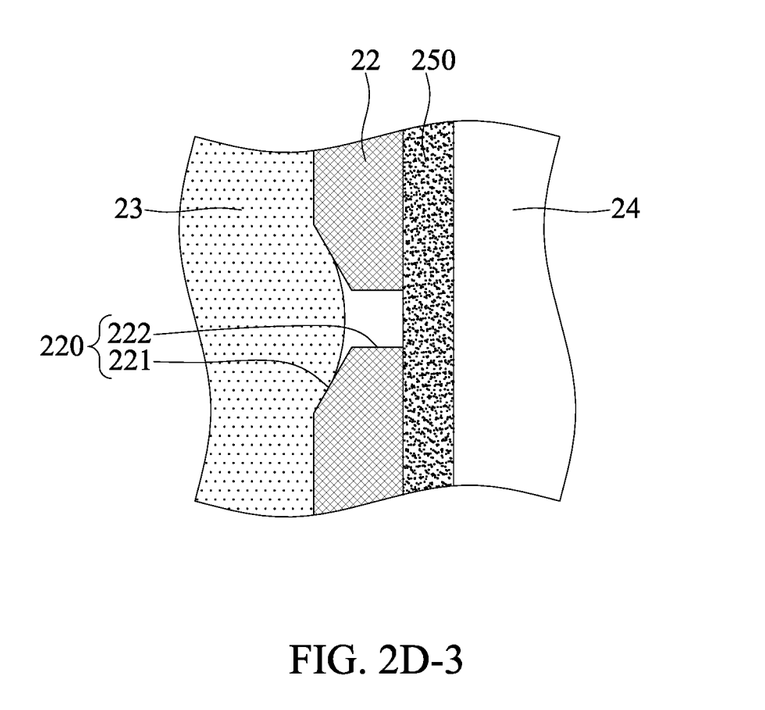

In an embodiment, the heat dissipating material 23 serves as a thermal interface material (TIM) for bonding with the heat generating object 2a as shown in FIG. 2D-1. In an example, an air gap 230 is formed between the outer periphery of the heat dissipating material 23 and the inner periphery of the heat dissipating body 22. The air gap 230 and the fluid segment 221 together define a fluid regulating space A. If the heat dissipating material 23 expands towards the heat dissipating body 22 after being heated, since the heat dissipating material 23 is fluid and not compressible, the fluid regulating space A can serve to regulate the volume of the heat dissipating material 23 during thermal expansion and contraction. As shown in FIGS. 2D-2 and 2D-3, the heat dissipating material 23 may fill up the air gap 230 and flow into the fluid segment 221. This avoids the explosion or "popcorn" effect of the electronic package 2.

Moreover, owing to surface tension and cohesion, the design of the width W of the gas segment 222 of the heat dissipating body 22 stops the heat dissipating material 23 from spreading and flowing out from the receiving space S. Thus, the heat dissipating body 22 can prevent the heat dissipating material 23 from leaking from the sides (that is, the sides 25c of the electronic component 25). In an example, the width W is from 10 to 1200 µm, and preferably from 10 to 800 µm.

Furthermore, the fluid segment 221 can accommodate a portion of the heat dissipating material 23, thus regulating the volume of the heat dissipating material 23 as shown in FIGS. 2D-2 and 2D-3. The gas segment 222 enables air to flow therein, thus regulating the volume of gas by allowing excess gas to quickly dissipate to the designated areas, and the heat dissipating material 23 will not occupy the gas segment 222.

In addition, the volume of the fluid regulating space A is greater than or equal to the difference between the volume expansion of the heat dissipating material 23 at high temperature (around 300° C.). (as shown by a change in volume e of the heat dissipating material 23 in FIG. 4D-2 relative to FIG. 4D-1) and the change in volume of the receiving space S due to warpage when heated (at around 300° C.) (i.e., this change in volume equals the volume of the receiving space S1 in warpage as shown in FIG. 2C-3 minus the volume of normal receiving space S, wherein if the volume of the receiving space S expands when heated, this change in volume e is positive, whereas if the volume of the receiving space S contracts when heated, this change in volume e is negative), that is, A≥e−(S1−S). In an example, when under a normal temperature, and when the heat dissipating material 23 is a liquid metal (the ratio of Ga and In is 7:3, but the present disclosure is not limited to this), the ratio of the volume of the fluid regulating space A and the volume of the heat dissipating material 23 in the range of 27.72 to 146.16 µm³/mm³ achieves the best volume regulation of the fluid, and optimises the effective contact dissipation area between the heat dissipating material 23 and the heat sink 2b before and after warpage due to heat. It can be understood that the volume of the fluid regulating space A should be selected by taking into account the volume expansion of the heat dissipating material 23 as well as the change in volume of the receiving space S due to warpage when heated.

Therefore, in the electronic package 2 of the present disclosure, the fluid regulating space A defined by the air gap 230 formed between the heat dissipating body 22 and the heat dissipating material 23 and the fluid segments 221 provides a volume regulating space for the heat dissipating material 23 during thermal expansion and contraction, thereby eliminating explosions caused by the incompressible nature of the fluid. It can be understood that the fluid regulating space A can only include the fluid segments 221 with no air gap 230 between the heat dissipating body 22 and the heat dissipating material 23, and fluid volume is regulated only by the fluid segments 221.

Furthermore, the regulating channels 220 of the heat dissipating body 22 provide space for regulation the thermal expansion of the heat dissipating material 23, and the gas segments 222 further provides regulation of air volume to allow air to be dispelled outside without being compressed. Thus, compared to the prior art, the fluid segments 221 of the present disclosure provides the space for regulating the thermal expansion of the heat dissipating material 23, so that under high temperatures, the heat dissipating material 23 can be securely applied on the non-active face 25b of the electronic component 25, and the design of the width W of the gas segments 222 stops the heat dissipating material 23 from flowing into the gas segments 222 through the effect of surface tension and cohesion. This not only prevents the heat dissipating material 23 from flowing outside of the electronic package 2, but also prevents contamination of other components external to the electronic package 2. Also, the ability of the gas segments 222 to regulate pressure eliminates the "popcorn" problem.

Moreover, the cross-sectional areas D of the fluid segments 221 are tapered, such that the width D1 at the entrance in which the heat dissipating material 23 flows is greater (thus has less pressure) as shown in FIG. 2D-1. As a result, when the heat dissipating material 23 is under pressure, the heat dissipating material 23 will flow towards the fluid segments 221. The tapering design of the fluid segments 221 also effectively increases the regulating space for the volume of the fluid.

FIGS. 3A-1, 3B and 3C are schematic cross-sectional views illustrating a method of manufacturing an electronic package 3 in accordance with a second embodiment of the present disclosure. The second embodiment differs from the first embodiment in the structure of the heat sink 3b, and similarities between the two will therefore not be further illustrated to avoid repetitions.

Figure 3A:
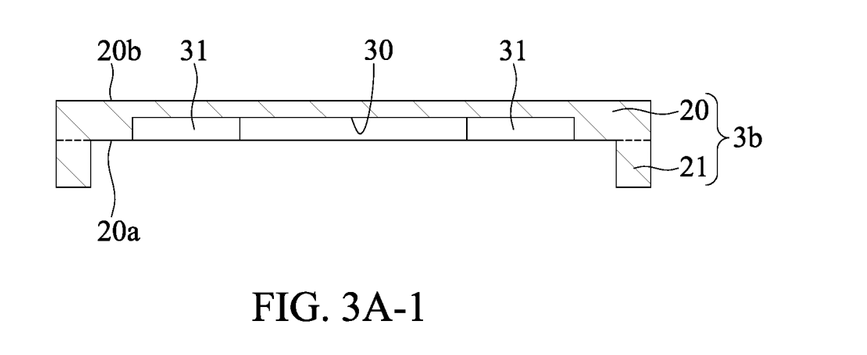
Figure 3A:
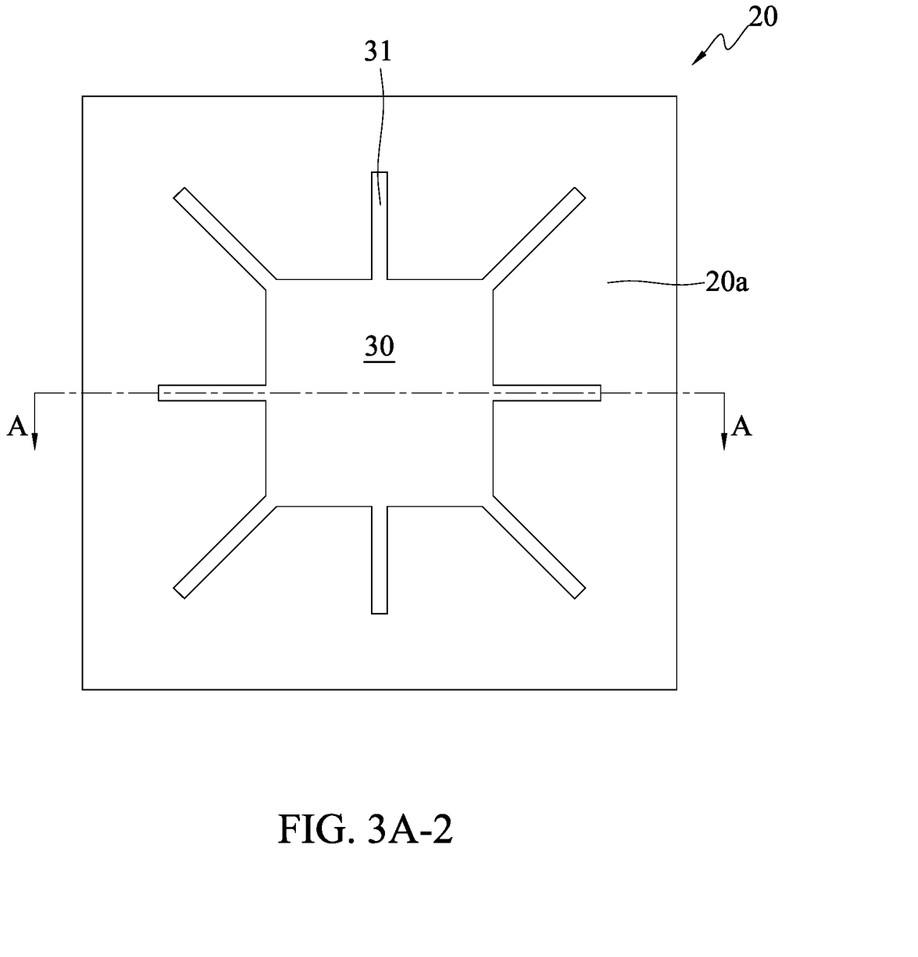

As shown in FIG. 3A-1, a heat sink 3b having a recess 30 (e.g., an indentation) is provided. The recess 30 is formed on the first side 20a of the heat dissipating plate 20 and has a rectangular shape as shown in FIG. 3A-2.

In an embodiment, the recess 30 is located at the center of the surface of the first side 20a of the heat dissipating plate 20. At least one auxiliary channel 31 interconnected with the edge of the recess 30 can also be formed on the first side 20a of the heat dissipating plate 20. For example, the locations of the auxiliary channel 31 can correspond to the location of the regulating channel 220. It can be understood that the shape of the auxiliary channel 31 can be designed according to needs, for example, in conformity to the shape of the regulating channel 220 and with uniform width (as straight grooves shown in FIG. 3A-2, for example) or other configurations, and the present disclosure is not limited as such.

Figure 3B:
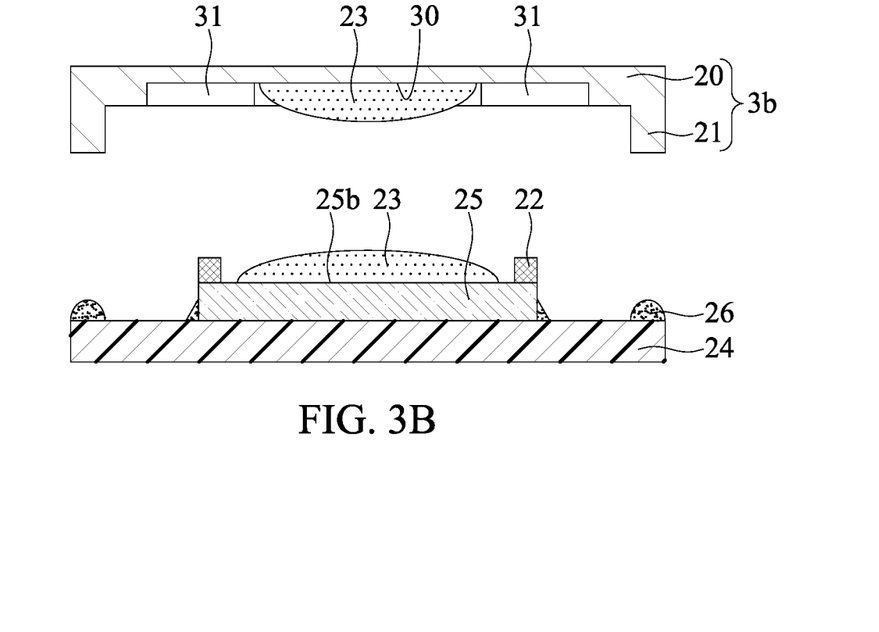

As shown in FIG. 3B, the manufacturing step illustrated in FIG. 2B is performed to form the heat dissipating material 23 on the non-active face 25b of the electronic component 25, and some of the heat dissipating material 23 can be provided in the recess 30 of the heat sink 3b.

Figure 3C:
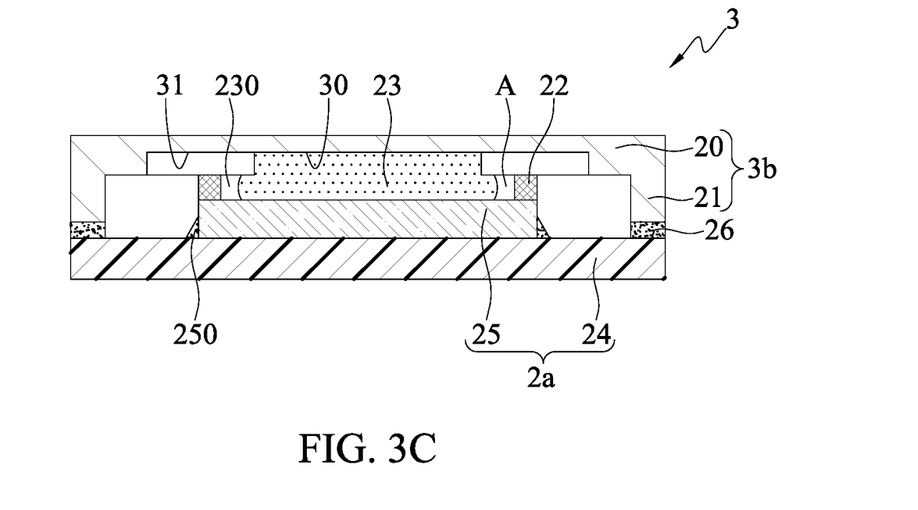

As shown in FIG. 3C, the heat sink 3b is bonded onto the heat generating object 2a. For instance, the heat dissipating plate 20 is bonded onto the electronic component 25 of the heat generating object 2a via the heat dissipating material 23, and the support legs 21 of the heat sink 2b are bonded onto the bonding material 26 on the carrier structure 24 of the heat generating object 2a, such that a receiving space is formed by the non-active face 25b of the electronic component 25, the heat dissipating plate 20, the recess 30 and the heat dissipating body 22 for receiving the heat dissipating material 23, wherein the recess 30 is filled with the heat dissipating material 23. Thereafter, curing is performed to obtain the desired electronic package 3.

Figure 3D:
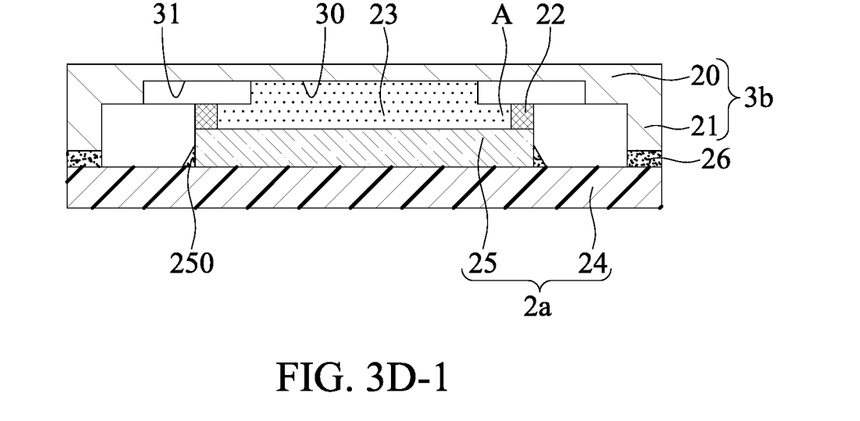
Figure 3D:
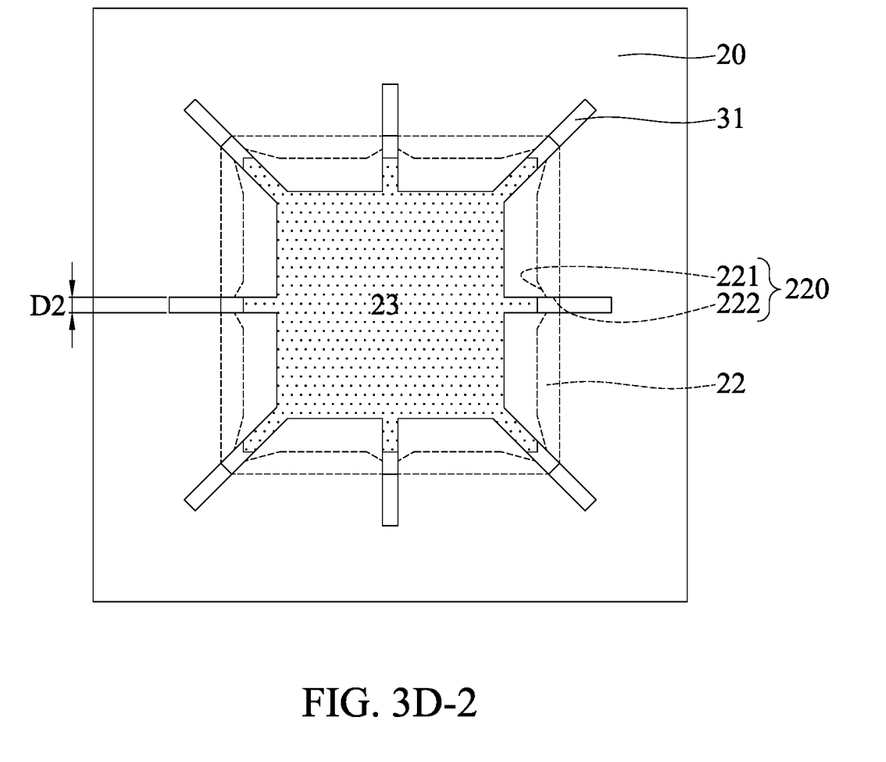

In an embodiment, a fluid regulating space A is formed between the heat dissipating body 22 and the heat dissipating material 23 to serve as a volume regulating space for the heat dissipating material 23 during thermal expansion and contraction, and if the heat dissipating material 23 expands out towards the heat dissipating body 22 during thermal expansion, the fluid regulating space A can provide volume regulation for the heat dissipating material 23 during thermal expansion, such as the heat dissipating material 23 shown in FIGS. 3D-1 and 3D-2 filling up the air gap 230.

Moreover, the auxiliary channel 31 is used for regulating the volume of gas, so as to allow the gas to escape and prevent the "popcorn" issue. The auxiliary channel 31 can be in communication with the regulating channel 220 or not in communication with the regulating channel 220. The auxiliary channel 31 achieves the same the technical effect as the gas segment 222, which is to provide regulation for the air volume, so that air can be expelled outside instead of being compressed. Thus, with the design of the width D2 of the auxiliary channel 31, for example, of a width D2 of 10 to 1200 μm, and preferably, 10 to 800 μm, as shown in FIG. 3D-2, through surface tension and cohesion, the auxiliary channel 31 is capable of stopping the heat dissipating material 23 from flowing into the auxiliary channel 31. This not only prevents the heat dissipating material 23 from flowing outside of the electronic package 2, but also prevents contamination of other components external to the electronic package 2. Also, the auxiliary channel 31 is capable of regulating pressure to prevent the occurrence of "popcorn" effect.

Therefore, in the electronic package 3 of the present disclosure, the design of the recess 30 in the heat sink 3b increases the space for receiving the heat dissipating material 23, so more of the heat dissipating material 23 can be accommodated. Thus, when the electronic package 3 warps when heated (as shown in FIG. 2C-3), since more of the heat dissipating material 23 was pre-filled, the amount of deformation of the receiving space caused by the warpage can be compensated, so that the heat dissipating contact area between the heat dissipating material 23 and the heat sink 3b can still meet demands and that heat dissipation can be achieved effectively. Preferably, when the warpage of the electronic package 3 is U-shaped (e.g., like a smiley face delineated by a dashed contour R shown in FIG. 2C-3), the effect of compensation brought about by the recess 30 is more prominent. In other words, in the first embodiment, when warpage such as that shown in FIG. 2C-3 occurs, the contact area between the heat dissipating material 23 and the heat dissipating plate 20 will be reduced, so its heat dissipation efficiency is not as good as that of the second embodiment.

FIGS. 4A-1, 4B and 4C-1 are schematic cross-sectional views illustrating a method of manufacturing an electronic package 4 in accordance with a third embodiment of the present disclosure. The third embodiment differs from the first embodiment in the design of the heat sink 4b, and similarities between the two will therefore not be further illustrated to avoid repetitions.

Figure 4A:
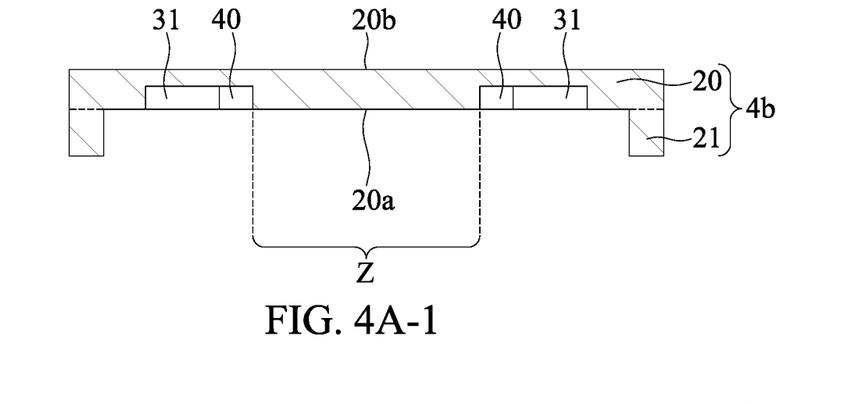
Figure 4A:
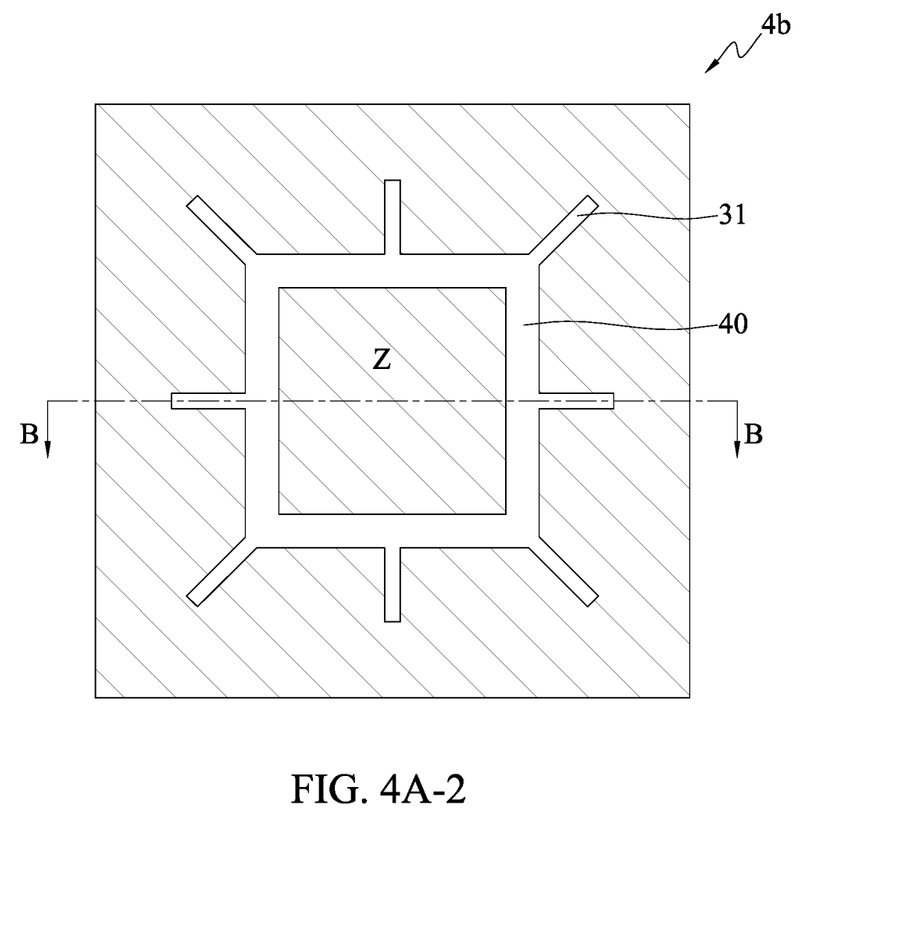

As shown in FIG. 4A-1, a heat sink 4b having a recess 40 (e.g., groove-like recess) is provided, and the recess 40 is formed on the first side 20a of the heat dissipating plate 20 into a loop, such as a rectangular loop shown in FIG. 4A-2.

In an embodiment, the recess 40 is provided at locations corresponding to the edge of the non-active face 25b of the electronic component 25 and inside the loop of the heat dissipating body 22 to be formed on the edge of a central surface area Z of the first side 20a of the heat dissipating plate 20 as shown in FIG. 4A-2, and at least one auxiliary channel 31 interconnected with the recess 40 is also formed on the first side 20a of the heat dissipating plate 20. For example, the location of the auxiliary channel 31 can correspond to the location of the regulating channel 220.

Figure 4B:
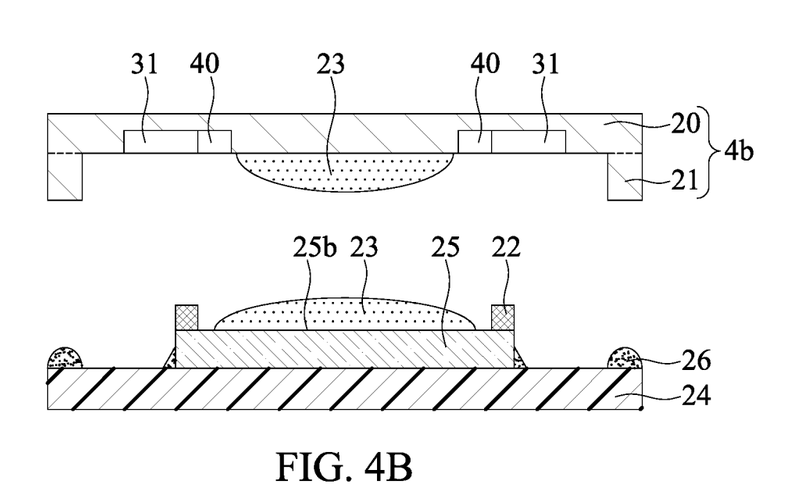
Figure 4C:
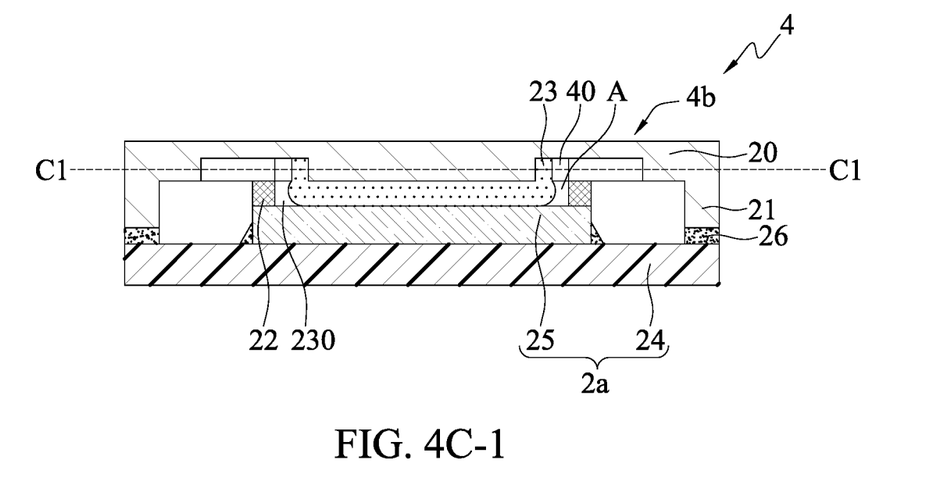

As shown in FIG. 4B, the manufacturing step illustrated in FIG. 2B is performed to form the heat dissipating material 23 on the non-active face 25b of the electronic component 25, and some of the heat dissipating material 23 can be provided on the heat dissipating plate 20 inside the loop of the recess 40.

Figure 4C:
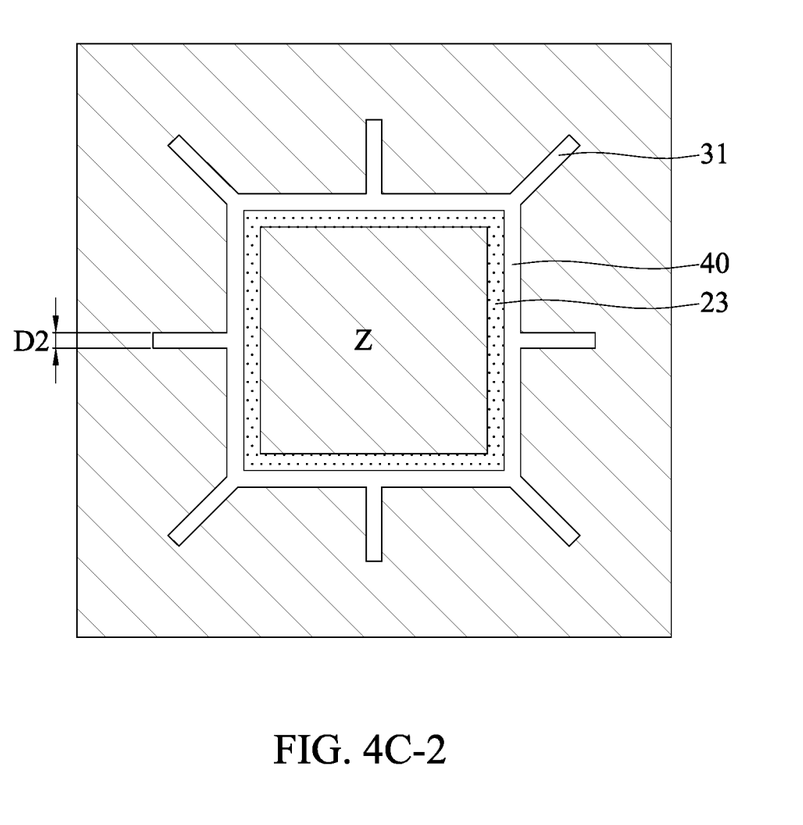
Figure 4D:
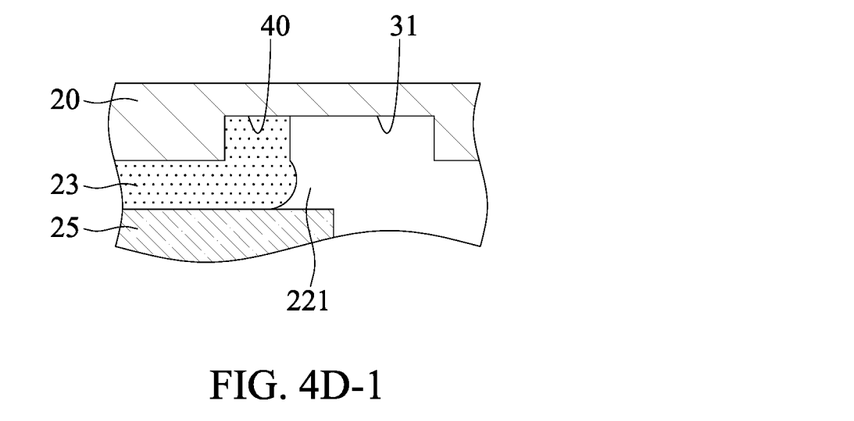
Figure 4D:
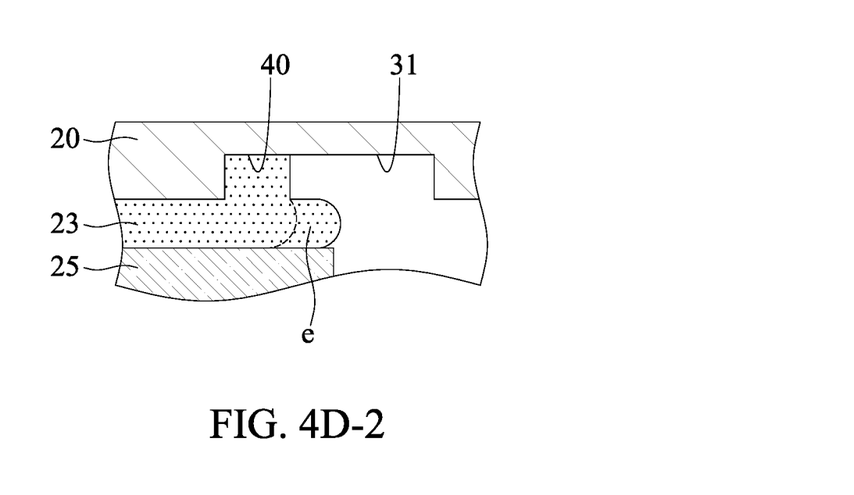

As shown in FIG. 4C-1, the heat sink 4b is bonded onto the heat generating object 2a. For instance, the heat dissipating plate 20 is bonded onto the electronic component 25 of the heat generating object 2a via the heat dissipating material 23, and the support legs 21 of the heat sink 2b are bonded onto the bonding material 26 on the carrier structure 24 of the heat generating object 2a, such that a receiving space is formed by the non-active face 25b of the electronic component 25, the heat dissipating plate 20, the recess 40 and the heat dissipating body 22 for receiving the heat dissipating material 23, wherein the recess 40 is filled with the heat dissipating material 23 (as shown in FIG. 4C-2). Thereafter, curing is performed to obtain the desired electronic package 4.

In an embodiment, the heat dissipating material 23 expands out towards the heat dissipating body 22 during thermal expansion, such that the fluid regulating space A is filled by the heat dissipating material 23 (as shown in FIGS. 2D-2 to 2D-3).

Therefore, in the electronic package 4 of the present disclosure, the design of the recess 40 in the heat sink 4b increases the space for receiving the heat dissipating material 23, so more of the heat dissipating material 23 can be accommodated as shown in FIG. 4C-1. Thus, when the electronic package 4 warps due to heat (as shown in FIG. 2C-3), since more of the heat dissipating material 23 was pre-filled, the amount of deformation of the receiving space S caused by the warpage can be compensated, so that the heat dissipating contact area between the heat dissipating material 23 and the heat sink 4b can still meet demands and heat dissipation can be achieved effectively. Preferably, when the warpage of the electronic package 4 resembles an inverted U shape (e.g., like a crying face delineated by a solid contour R1 shown in FIG. 2C-3), the effect of compensation brought about by the recess 40 is more prominent.

Moreover, the auxiliary channel 31 is used for regulating the volume of gas, so as to allow the gas to escape and prevent the "popcorn" issue. The auxiliary channel 31 can be in communication with the regulating channel 220 or not in communication with the regulating channel 220. The auxiliary channel 31 achieves the same the technical effect as the gas segment 222, which is to provide regulation for the air volume, so that air can be expelled outside instead of being compressed. Thus, with the design of the width D2 of the auxiliary channel 31, for example, of a width D2 of 10 to 1200 μm, and preferably, 10 to 800 μm, as shown in FIG. 4C-2, through surface tension and cohesion, the auxiliary channel 31 is capable of stopping the heat dissipating material 23 from flowing into the auxiliary channel 31. This not only prevents the heat dissipating material 23 from flowing outside of the electronic package 2, but also prevents contamination of other components external to the electronic package 2. Also, the auxiliary channel 31 is capable of regulating pressure to prevent the occurrence of "popcorn" effect.

In another embodiment, the recess 40 can also resumes the shape of a straight line and is provided along the edge of the non-active face 25b of the electronic component 25 and inside the loop of the heat dissipating body 22 to be formed on the edge of the central surface area Z of the first side 20a of the heat dissipating plate 20.

The present disclosure further provides an electronic package 2, 3, 4, which includes: a carrier structure 24, an electronic component 25 disposed on the carrier structure 24, a heat dissipating body 22 provided on the electronic component 25 in a loop, a heat dissipating material 23 disposed on the electronic component 25, and a heat sink 2b, 3b, 4b disposed on the heat dissipating body 22.

A receiving space S is formed by the electronic component 25, the heat dissipating body 22 and the heat sink 2b, 3b, 4b.

The heat dissipating material 23 is formed in the receiving space S and in contact with the heat sink 2b, 3b, 4b and the electronic component 25, wherein a fluid regulating space A is formed between the heat dissipating material 23 and the heat dissipating body 22.

In an embodiment, the fluid regulating space A is filled with air (e.g., an air gap 230 and/or a fluid segment 221) or filled with the heat dissipating material 23.

In an embodiment, the heat dissipating body 22 surrounds the heat dissipating material 23 in a loop, such that an outer periphery of the heat dissipating material 23 and an inner periphery of the heat dissipating body 22 define the fluid regulating space A.

In an embodiment, the heat dissipating body 22 is provided along a surface edge of the electronic component 25.

In an embodiment, the heat dissipating body 22 is formed with at least one regulating channel 220, which includes a gas segment 222 that interconnects the fluid regulating space A with the outside of the heat dissipating body 22. For example, the regulating channel 22 further includes a fluid segment 221 formed at an inner loop surface that is in communication with the gas segment 222 in a tapered configuration (e.g., the fluid segment 221 is tapered towards the gas segment 222), such that the fluid segment 221 defines the fluid regulating space A. Alternatively, the minimum width W of the regulating channel 220 is in the range of 10 to 1200 μm, and preferably 10 to 800 μm.

In an embodiment, the volume of the fluid regulating space A is greater than or equal to the difference between the volume expansion of the heat dissipating material 23 when heated and a change in volume of the receiving space S when heated.

In an embodiment, the ratio of the volume of the fluid regulating space A and the volume of the heat dissipating material 23 is in the range of 27.72 to 146.16 $\mu m^3/mm^3$.

In an embodiment, the heat sink 3b, 4b includes a recess 30, 40 corresponding to the receiving space S, and the heat sink 3b, 4b is filled with the heat dissipating material 23. For example, the recess 30 is an indentation located on the heat sink 3b corresponding to the center of the receiving space S. Alternatively, the recess 40 is a groove provided on the heat sink 4b corresponding to the edge of the receiving space S. Alternatively, the heat sink 3b, 4b further includes an auxiliary channel 31 interconnected with the recess 30, 40. Furthermore, the heat dissipating body 22 is formed with at least one regulating channel 220, which includes a gas segment 222 that interconnects the fluid regulating space A with the outside of the heat dissipating body 22, such that the auxiliary channel 31 is in communication or not in communication with the gas segment 222.

In conclusion, the electronic package of the present disclosure and the manufacturing method thereof, by surrounding the heat dissipating material with the heat dissipating body, the heat dissipating material can be prevented from flowing out of the electronic package, thereby preventing contamination of other components external to the electronic package. Also, the fluid regulating space formed between the heat dissipating body and the heat dissipating material serves as a volume regulating space for the heat dissipating material during thermal expansion and contraction, thereby avoiding "popcorn" effect caused by the incompressible nature of the fluid.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
   a carrier structure;
   an electronic component disposed on the carrier structure;
   a heat dissipating body disposed on the electronic component in a loop, wherein the heat dissipating body is formed with at least one regulating channel having a gas segment;
   a heat sink disposed on the heat dissipating body, wherein the electronic component, the heat dissipating body and the heat sink form a receiving space; and
   a heat dissipating material formed in the receiving space and in contact with the heat sink and the electronic component, wherein a fluid regulating space is formed between the heat dissipating material and the heat dissipating body, and the gas segment interconnects the fluid regulating space with an outside of the heat dissipating body,
   wherein the regulating channel further includes a fluid segment formed on an inner loop surface, and wherein the fluid segment is in communication with the gas segment in a tapered fashion that narrows towards the gas segment, such that the fluid segment defines the fluid regulating space.

2. The electronic package of claim 1, wherein the fluid regulating space contains air.

3. The electronic package of claim 1, wherein the heat dissipating body surrounds the heat dissipating material in a loop, such that an outer periphery of the heat dissipating material and an inner periphery of the heat dissipating body define the fluid regulating space.

4. The electronic package of claim 1, wherein the heat dissipating body is disposed along an upper surface edge of the electronic component.

5. The electronic package of claim 1, wherein a minimum width of the gas segment is in a range of 10 μm to 1,200 μm.

6. The electronic package of claim 1, wherein a minimum width of the gas segment is in a range of 10 μm to 800 μm.

7. The electronic package of claim 1, wherein a volume of the fluid regulating space is greater than or equal to a difference between a volume expansion of the heat dissipating material when heated and a change in volume of the receiving space when heated.

8. The electronic package of claim 1, wherein a ratio of a volume of the fluid regulating space and a volume of the heat dissipating material is in a range of 27.72 $\mu m^3/mm^3$ to 146.16 $\mu m^3/mm^3$.

9. The electronic package of claim 1, wherein the heat sink includes a recess corresponding to the receiving space, and wherein the recess is fled with the heat dissipating material.

10. The electronic package of claim 9, wherein the recess is an indentation located on the heat sink corresponding to a center of the receiving space.

11. The electronic package of claim 9, wherein the recess is a groove disposed on the heat sink corresponding to an edge of the receiving space.

12. The electronic package of claim 9, wherein the heat sink further includes an auxiliary channel interconnected with the recess.

13. The electronic package of claim 12, wherein the axillary channel is in communication or not in communication with the gas segment.

14. A method of manufacturing an electronic package, comprising:
   providing a heat generating object and a heat sink, wherein the heat generating object includes a carrier structure and an electronic component disposed on the carer structure;
   disposing a heat dissipating body on the electronic component in a loop, wherein the heat dissipating body is formed with at least one regulating channel having a gas segment;
   forming a heat dissipating material on the electronic component; and
   disposing the heat sink on the heat dissipating body, wherein the electronic component, the heat dissipating body and the heat sink form a receiving space, wherein the heat dissipating material is inside the receiving space and in contact with the heat sink and the electronic component, and wherein a fluid regulating space is formed between the heat dissipating material and the heat dissipating body, and the gas segment interconnects the fluid regulating space with an outside of the heat dissipating body,
   wherein the regulating channel further includes a fluid segment formed on an inner loop surface, and wherein the fluid segment is in communication with the gas segment in a tapered fashion that narrows towards the gas segment, such that the fluid segment defines the fluid regulating space.

15. The method of claim 14, wherein the fluid regulating space contains air.

16. The method of claim 14, wherein the heat dissipating body surrounds the heat dissipating material in a loop, such that an outer periphery of the heat dissipating material and an inner periphery of the heat dissipating body define the fluid regulating space.

17. The method of claim 14, wherein the heat dissipating body is disposed along an upper surface edge of the electronic component.

18. The method of claim 14, wherein a minimum width of the regulating channel is in a range of 10 μm to 1,200 μm.

19. The method of claim 14, wherein a minimum width of the regulating channel is in a range of 10 μm to 800 μm.

20. The method of claim 14, wherein a volume of the fluid regulating space is greater than or equal to a difference between a volume expansion of the heat dissipating material when heated and a change in volume of the receiving space when heated.

21. The method of claim 14, wherein a ratio of a volume of the fluid regulating space and a volume of the heat dissipating material is in a range of 27.72 μm/mm$^3$ to 146.16 μm$^3$/mm$^3$.

22. The method of claim 14, wherein the heat sink includes a recess corresponding to the receiving space, and wherein the recess is filed with the heat dissipating material.

23. The method of claim 2, wherein the recess is an indentation located on the heat sink corresponding to a center of the receiving space.

24. The method of claim 22, wherein the recess is a groove disposed on the heat sink corresponding to an edge of the receiving space.

25. The method of claim 22, wherein the heat sink further includes an auxiliary channel interconnected with the recess.

26. The method of claim 25, wherein the axillary channel is in communication or not in communication with the gas segment.

\* \* \* \* \*